United States Patent
Schmid et al.

(10) Patent No.: US 7,224,710 B2
(45) Date of Patent: May 29, 2007

(54) OPTICALLY PUMPED SEMICONDUCTOR LASER APPARATUS

(75) Inventors: Wolfgang Schmid, Deuerling/Hillohe (DE); Tony Albrecht, Bad Abbach (DE)

(73) Assignee: Osram GmbH, Munich (DE)

( * ) Notice: Subject to any disclaimer, the term of this patent is extended or adjusted under 35 U.S.C. 154(b) by 161 days.

(21) Appl. No.: 10/666,478

(22) Filed: Sep. 19, 2003

(65) Prior Publication Data

US 2004/0141538 A1 Jul. 22, 2004

(30) Foreign Application Priority Data

Sep. 19, 2002 (DE) ................... 102 43 545

(51) Int. Cl.
H01S 5/00 (2006.01)
H01S 3/04 (2006.01)
H01S 3/09 (2006.01)

(52) U.S. Cl. .................. 372/50.1; 372/36; 372/69

(58) Field of Classification Search ........... 372/38.06, 372/50.1–50.11, 69–72, 75, 78, 92, 96, 98, 372/50.124
See application file for complete search history.

(56) References Cited

U.S. PATENT DOCUMENTS

| | | | | |
|---|---|---|---|---|
| 5,513,204 A | * | 4/1996 | Jayaraman | 372/96 |
| 5,748,653 A | | 5/1998 | Parker | |
| 5,796,771 A | * | 8/1998 | DenBaars et al. | 372/75 |
| 6,434,180 B1 | * | 8/2002 | Cunningham | 372/50.1 |
| 6,535,537 B1 | * | 3/2003 | Kinoshita | 372/50.11 |
| 6,553,048 B2 | * | 4/2003 | Jiang et al. | 372/50.1 |
| 6,636,539 B2 | * | 10/2003 | Martinsen | 372/36 |
| 6,647,050 B2 | * | 11/2003 | Yuen et al. | 372/96 |
| 6,714,574 B2 | * | 3/2004 | Clayton et al. | 372/50.1 |
| 6,954,479 B2 | * | 10/2005 | Albrecht et al. | 372/50.1 |
| 2002/0001328 A1 | * | 1/2002 | Albrecht et al. | 372/50 |
| 2002/0075935 A1 | * | 6/2002 | Clayton | 372/75 |
| 2002/0146053 A1 | * | 10/2002 | Iwai | 372/75 |
| 2004/0208217 A1 | * | 10/2004 | Brick et al. | 372/50 |
| 2005/0031005 A1 | * | 2/2005 | Cheng et al. | 372/68 |

(Continued)

FOREIGN PATENT DOCUMENTS

DE 199 47 853 A1 4/2000

(Continued)

OTHER PUBLICATIONS

Michael D. Gerhold, et al., "Novel Design of a Hybrid-Cavity Surface-Emitting Laser", IEEE Journal of Quantum Electronics, vol. 34, No. 3, pp. 506-511, Mar. 1998.

(Continued)

Primary Examiner—James Menefee
Assistant Examiner—Phillip Nguyen
(74) Attorney, Agent, or Firm—Cohen Pontani Lieberman & Pavane LLP

(57) ABSTRACT

An optically pumped semiconductor laser apparatus having a vertical emitter (2) and having one pump laser (5) for optically pumping the vertical emitter (2), with the vertical emitter (2) and the pump laser (5) being monolithically integrated. The pump laser (5) and the vertical emitter (2) each have a radiation-emitting zone (3, 6). During operation, the temperature of the radiation-emitting zone (6) of the pump laser (5) is lower than the temperature of the radiation-emitting zone (3) of the vertical emitter (2).

21 Claims, 3 Drawing Sheets

U.S. PATENT DOCUMENTS

2006/0018354 A1* 1/2006 Albrecht et al. ....... 372/46.011
2006/0104327 A1* 5/2006 Karnutsch et al. ..... 372/50.124

FOREIGN PATENT DOCUMENTS

| DE | 100 26 734 A | 12/2001 |
|----|--------------|---------|
| EP | 1 220 392 A2 | 12/2001 |
| GB | 2 342 773 A  | 4/2000  |
| WO | WO 01/93386 A1 | 12/2001 |

OTHER PUBLICATIONS

Rainer Michalzik, "Modellierng und Design von Laserdioden mit Vertikalresonator", vol. 9, No. 257, pp. 1-79, VDI-Verlag, 1997.

Ralph Pelz, Diploma Thesis published in Aug. 2002.

* cited by examiner

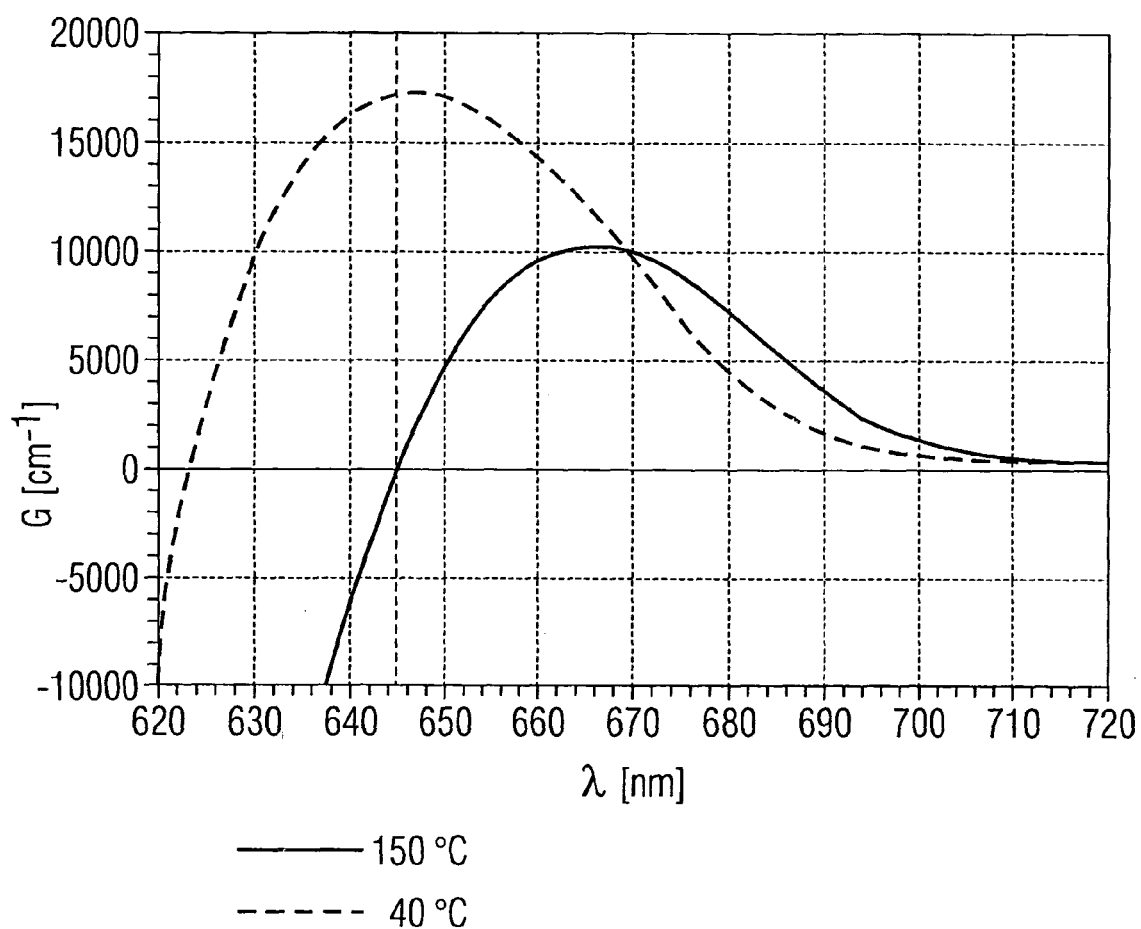

OPTICALLY PUMPED SEMICONDUCTOR LASER APPARATUS

FIELD OF THE INVENTION

The invention relates to an optically pumped semiconductor laser apparatus having a vertical emitter and having at least one pump laser for optically pumping the vertical emitter, with the vertical emitter and the pump laser being monolithically integrated.

BACKGROUND OF THE INVENTION

Laser apparatuses such as these are known, for example, from the document DE 100 26 734.3. This application claims the priority of the German patent application DE 102 43 545.6 dated Sep. 19, 2002. The content of the documents DE 100 26 734.3 and DE 102 43 545.6 is herewith incorporated by reference into the present description. These documents describe an optically pumped quantum well structure which is arranged together with a pump radiation source, for example a pump laser, on a common substrate. The quantum well structure and the pump radiation source have different radiation-emitting layers, which are designed such that the wavelength of the which is emitted from the pump radiation source is shorter than the wavelength of the radiation which is produced by the quantum well structure. This wavelength difference is necessary since, otherwise, if the pump wavelength and the emission wavelength were the same, the radiation produced by the quantum well structure would be absorbed in the quantum well structure in the same way as the pump radiation and, in consequence, the efficiency of the laser apparatus would be greatly reduced. In the case of a vertically emitting laser formed by the quantum well structure, this would in particular prevent the stimulation of oscillations of the vertically emitting laser.

A semiconductor laser apparatus of that kind may, for example, be grown in successive epitaxial steps on an epitaxial substrate. In this case, the quantum well structure is initially grown over the entire area, after which a subarea of it is removed, and the pump radiation source is grown on the area of the epitaxial substrate exposed in this way. Since each epitaxy step increases both the production duration and also the costs incurred by it, production with as few epitaxy steps as possible is desirable.

SUMMARY OF THE INVENTION

One object of the present invention is to provide an optically pumped semiconductor laser apparatus which can be produced as easily as possible. A particular aim for the semiconductor laser apparatus is to make it possible to produce a vertical emitter and a pump laser for the vertical emitter at least partially in common epitaxy steps.

This and other objects are attained in accordance with one aspect of the invention directed to a semiconductor laser apparatus to be formed with a vertical emitter and a pump laser for optical pumping of the vertical emitter, with the pump laser and the vertical emitter being monolithically integrated. During operation, the pump laser has a radiation-emitting zone at a first temperature, and the vertical emitter has a radiation-emitting zone at a second temperature, which is higher than the first temperature.

If the temperature distribution is not uniform, the temperature of a radiation-emitting zone may in each case be replaced by the mean temperature of the respective radiation-emitting zone.

Alternatively, it is possible to apply the criterion that the minimum temperature of the radiation-emitting zone of the vertical emitter is higher than the maximum temperature of the radiation-emitting zone of the pump laser.

This advantageously results, on the basis of the temperature dependency of the emission wavelength, in the emission wavelength of the vertical emitter being higher than the emission wavelength of the pump laser even with radiation-emitting zones whose structure is otherwise the same. The pump laser and the vertical emitter can thus be produced jointly by means of an epitaxy method without any need to manufacture the pump laser and the vertical emitter in separate, successive epitaxy steps.

In an advantageous development of the invention, the vertical emitter and the pump laser are arranged on a common mount, for example a heat sink, with the thermal resistance between the respective radiation-emitting zones and the mount for the pump laser being less than for the vertical emitter. During operation, a thermal equilibrium can occur in this case, with the temperature of the radiation-emitting zone of the vertical emitter being higher than the temperature of the radiation-emitting zone of the pump laser. During operation, this results in the pump wavelength being shorter than the emission wavelength of the vertical emitter.

A higher thermal resistance can be provided for the vertical emitter than for the pump laser by, for example, arranging a mirror layer, for example in the form of a Bragg mirror, between the radiation-emitting zone of the vertical emitter and the mount, with this mirror layer representing a resonator mirror of the vertical emitter. There is no need for any such layer or layer sequence for the pump laser since said laser is preferably embodied as an edge emitter, such that the pump radiation propagates essentially parallel to the mirror layer of the vertical emitter.

In an arrangement of this kind, the pump laser is thermally coupled to the mount better than the vertical emitter owing to the lack of the mirror layer. In the case of the pump laser, the thermal resistance between the radiation-emitting zone and the mount is thus less than in the case of the vertical emitter. This leads to the desired reduction in the emission wavelength of the pump laser in comparison to that of the vertical emitter.

For this invention, the radiation-emitting zones of the vertical emitter and of the pump laser are preferably grown by means of an epitaxy method in a common epitaxy step. The radiation-emitting zones then have the same structure and composition. In the case of a conventional monolithically integrated optically pumped semiconductor laser apparatus, this would result in the pump laser and the vertical emitter having the same emission wavelength, with the disadvantages mentioned at the beginning.

These disadvantages are avoided by the temperature difference between the radiation-emitting zones in the invention, in which the semiconductor laser apparatus can be produced technically more easily with an advantageously reduced number of epitaxy steps.

The invention also avoids complex adjustment and mutual matching of the layer thickness of the pump laser and vertical emitter, as is required for structures which are grown successively, in order that the radiation-producing layers are located at the same height above the epitaxial substrate. Otherwise, the pump radiation would not be radiated precisely into the active layer of the vertical emitter, so that the pump efficiency of the semiconductor apparatus would be greatly reduced.

In the case of the invention, however, the active layers in which both the radiation-emitting zone of the pump laser and the radiation-emitting zone of the vertical emitter are formed during operation may be manufactured jointly in one epitaxy step, and, going beyond this, even as a continuous layer, such that the pump radiation of the pump laser is optimally coupled into the vertical emitter.

BRIEF DESCRIPTION OF THE DRAWINGS

Further features, advantages and useful features of the invention will become evident from the following description of two exemplary embodiments of the invention in conjunction with FIGS. 1 to 3, in which:

FIG. 3 shows two gain spectra for a semiconductor laser apparatus according to the invention.

DETAILED DESCRIPTION OF THE DRAWINGS

Identical elements or elements having the same effect are provided with the same reference symbols in the figures.

Figure 1:
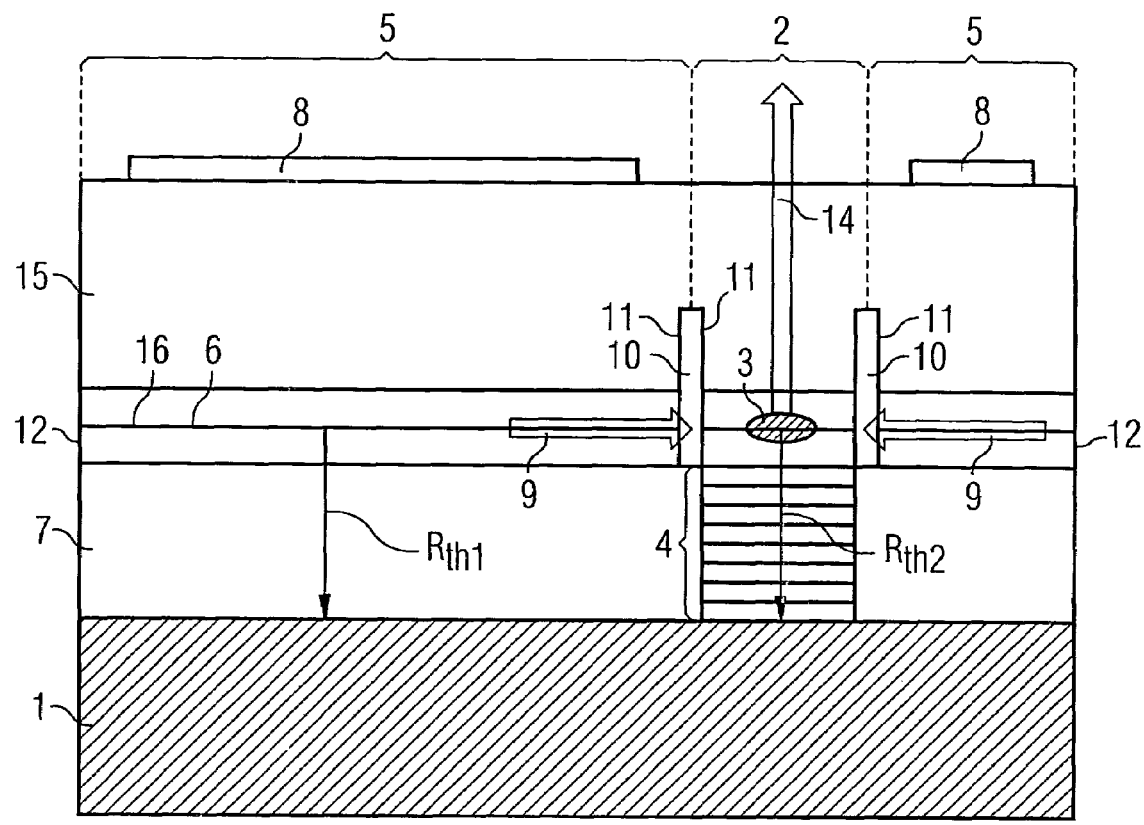
FIG. 1 shows a schematic sectional view of a first exemplary embodiment of a semiconductor laser apparatus according to the invention, FIGS. 2a, b, c and d show a schematic sectional view of a second exemplary embodiment of a semiconductor laser apparatus according to the invention, an associated temperature profile as well as the profile of the temperature and of the band gap along the active layer.

FIG. 1 shows, in the form of a section, a semiconductor laser apparatus having a number of semiconductor layers, for example based on the material system GaAs/AlGaAs, which are arranged on a mount 1, such as a heat sink for example, The semiconductor laser apparatus has a vertical emitter 2 and one or more pump lasers 5, which are monolithically integrated on a common substrate 15. The vertical emitter 2 and the pump laser are preferably grown epitaxially on the substrate 15. The radiation 14 which is produced by the vertical emitter 2 is coupled out through the substrate 15.

The vertical emitter 2 is preferably embodied as a vertically emitting laser, for example a VCSEL (vertical cavity surface emitting laser) or a disk laser. In the invention the direction terms "vertical" and "lateral" relate as usual to the substrate surface and to the layer plane of the semiconductor layers respectively. A vertical emitter thus has a main emission direction which includes an angle of about 90° with the substrate surface or with the layer plane while an edge emitter emits predominantly in the lateral direction, that is to say parallel to the substrate surface or the layer plane.

The vertical emitter 2 has an active layer 13 and two or more mirror layers 4 which form a Bragg mirror. A corresponding second mirror (which is not shown) may be provided as part of the semiconductor laser apparatus or as an external mirror, said mirror forming the laser resonator for the vertical emitter 2 together with the Bragg mirror.

The active layer 3 is preferably formed as a quantum well structure, for example, an SQW structure (single quantum well) or an MQW structure (multiple quantum well).

The pump lasers 5 are arranged laterally beside the vertical emitter 2. The active layer 16 of the pump lasers 5 is designed to be identical to the active layer 3 of the vertical emitter 2. Instead of the Bragg mirror 4, the pump lasers 5 have a p-contact layer 7 which is adjacent to the mount 1. There is no point in a Bragg mirror as in the case of the vertical emitter 2 in this case, since the emission from the pump lasers 5 occurs essentially parallel to the active layers 13, 16. In contrast, the p-contact layer 7 is used for introducing an operating current into the pump laser 5, and is not required for the optically pumped vertical emitter 2. An n-contact layer 8 is arranged on top of the laser apparatus, in the area of the pump lasers 5.

The Bragg mirror may, for example, be embodied as a sequence of alternating layers of aluminum gallium arsenide with different aluminum concentrations. Alternatively, the Bragg mirror may also be formed as a sequence of alternating layers of aluminum gallium arsenide and aluminum oxide. The aluminum oxide layers are preferably produced by means of moist-thermal oxidation. In this case, a high refractive index contrast is achieved at the interface between adjacent mirror layers and, in consequence, this results in a low penetration depth and little absorption of the vertical emitter radiation field within the Bragg mirror.

Trenches 10 which may be filled with a suitable insulation material are formed between the vertical emitter 2 and the pump lasers 5. In the area of the trenches 10, the pump lasers 5 have side boundary surfaces 11 which, together with the outer lateral boundary surfaces 12, form the laser mirrors for the pump lasers 5. Alternatively, these trenches 10 can also be dispensed with, with only the outer boundary surfaces 12 then forming the laser mirrors for the pump lasers 5, and the vertical emitter 2 being arranged within the laser resonator of the pump laser 5.

The thermal coupling of the radiation-producing layers 13, 16 for the vertical emitter 2 and for the pump laser 5 differs owing to the difference in the layer structure between the mount 1 and the active layers 13, 16. In particular, the thermal resistance $R_{th1}$ between the radiation-producing layers 16 of the pump lasers 5 and the mount 1 is less than the thermal resistance $R_{th2}$ of the radiation-producing layer 13 of the vertical emitter 2.

During operation, a radiation-emitting zone 6 is formed in the active layer 16 of the pump lasers 5, in which radiation-emitting zone 6 the pump laser radiation 9 for the vertical emitter is produced. The pump radiation 9 is coupled laterally into the active layer 13 of the vertical emitter. This results in the formation of a radiation-emitting zone 3 in the active layer 13 of the vertical emitter 2, in which zone the radiation 14 which is emitted by the vertical emitter 2 is generated.

The heat losses which are produced in the radiation-emitting zones 3, 6 are distributed in the lateral direction in the semiconductor laser apparatus, and are dissipated to the heat sink 1 via the thermal resistances, $R_{th1}$ and $R_{th2}$. This results in the radiation-emitting zone 3 of the vertical emitter 2 being at a temperature $T_2$ which is higher than the temperature $T_1$ of the radiation-emitting zone 6 of the pump lasers 5 during operation, as a thermal equilibrium.

In consequence, the emission wavelength of the active layers 13, 16 for the vertical emitter 2 is higher than that of the pump laser 5, despite their structure being identical otherwise, owing to the different temperatures $T_1$, $T_2$ so that, in the end, the vertical emitter 2 can be pumped efficiently by the pump lasers 5 despite the active layers 13, 16 having identical structures.

Figure 2A:
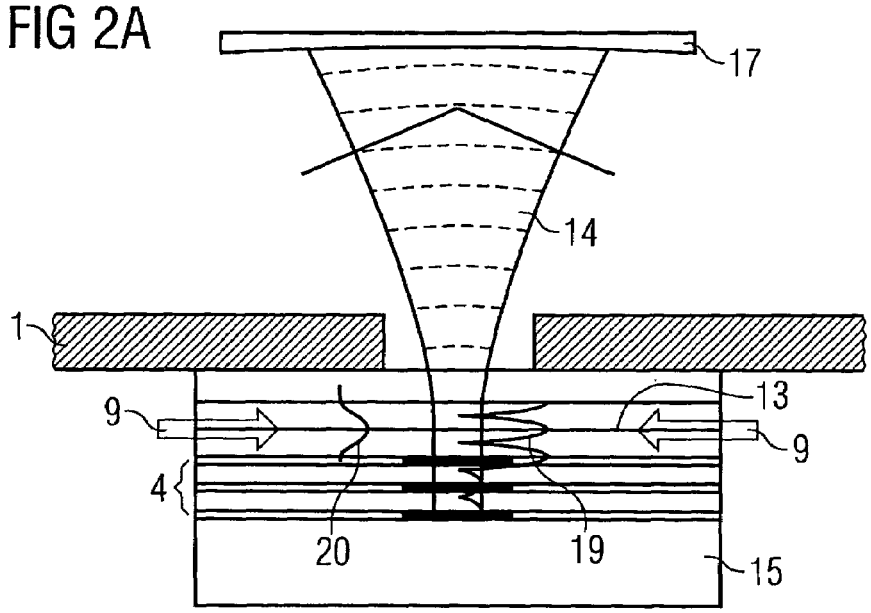

FIG. 2a shows a schematic sectional view of a second exemplary embodiment of a semiconductor laser apparatus according to the invention. For the sake of clarity, the illustration in this case only shows the region of the vertical emitter 2.

As in the case of the previous exemplary embodiment, the pump radiation 9 is generated by pump lasers (which are not shown) and is injected laterally into the active layer 13 of the vertical emitter. The emission 14 of the optically pumped vertical emitter takes place perpendicularly with respect to the propagation direction of the pump radiation 9 and to the active layer 3 of the vertical emitter.

The semiconductor apparatus is mounted on a mount 1 in the form of a heat sink which, in the area of the vertical emitter 2, has a cutout for the coupling out of the radiation. In contrast to the previous exemplary embodiment, the Bragg mirror 4 and the substrate 15 following said mirror are arranged on the side of the semiconductor apparatus facing away from the heat sink.

In the semiconductor apparatus that is illustrated in FIG. 2a, the vertical emitter is operated as a vertically emitting laser. The resonator of this laser is formed by the Bragg mirror 4 and by an external mirror 17 which is arranged on the side of the heat sink facing away from the semiconductor apparatus. The external mirror 17 is preferably at the same time used as an output mirror.

The standing wave field 19 created in the resonator bounded by the external mirror 17 and the Bragg mirror 4 is sketched schematically within the semiconductor apparatus. The resonator is in this case designed such that a field maximum is formed at the location of the active layer 13, thus resulting in a high degree of coupling between the standing wave field 19 and the optically pumped area of the vertical emitter 2.

The field profile 20 of the pump radiation is likewise illustrated schematically. In this case, the field maximum is located in the active layer 13 of the vertical emitter 2, in order to achieve good optical coupling of the pump radiation 9 to the vertical emitter 2.

The cutout within the mount results in partial dissipation of the heat produced in the radiation-emitting zone 3 of the vertical emitter in the lateral direction, thus effectively increasing the thermal resistance between the radiation-emitting zone 3 of the vertical emitter and the mount in comparison to the thermal resistance between the radiation-emitting zone of the pump laser (which is not shown) and the mount.

Figure 2B:
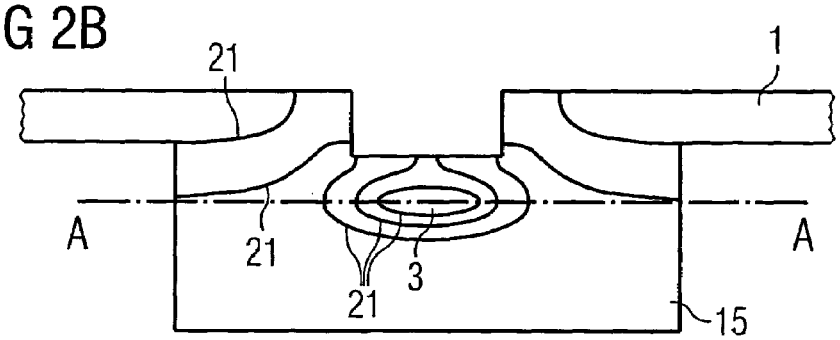

FIG. 2b shows the temperature profile arising during operation of the structure shown in FIG. 2a. The temperature of the radiation-emitting zone 3 of the vertical emitter is higher than the temperature of the environment, due to the cutout within the mount 1 in the area of the radiation-emitting zone 3 of the vertical emitter. The temperature of the schematically illustrated isotherms 21 decreases as the distance from the radiation-emitting zone 3 increases.

Figure 2C:
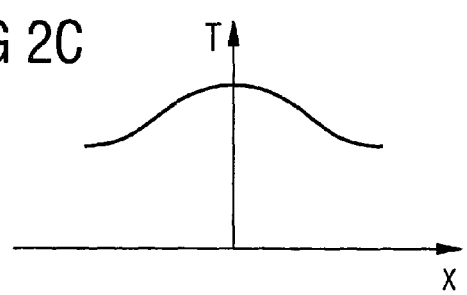

The temperature profile resulting from this along the active layer 13, that is to say along line A—A, is plotted in FIG. 2c. A temperature maximum occurs at the center of the radiation-emitting zone 3 or the center of the active layer 13, with the temperature decreasing in the lateral direction on both sides.

Figure 2D:
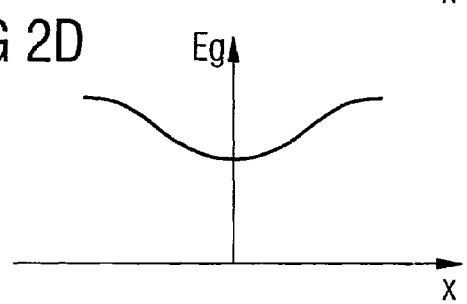

The associated band gap Eg along the active layer 13 is illustrated in FIG. 2d. Since the band gap decreases as the temperature increases, the band gap has a minimum in the center of the active layer 3 and increases on both sides in the lateral direction, that is to say towards the pump lasers which are arranged at the sides. This results in the emission wavelength of the vertical emitter being higher than the emission wavelength of the pump lasers.

FIG. 3 shows gain spectra for a semiconductor apparatus according to the invention. The gain factor G is plotted as a function of the emission wavelength (, calculated for a 5 nm thick compressively stressed InGaP-quantum film as a quantum well structure, and a charge carrier density of about 10–13 cm-2 at two different temperatures, T=40° C. and T=150° C.

As can be seen, the maximum of these gain spectra is shifted in the direction of the longer wavelengths with increasing temperature T. The emission wavelength is generally governed by the maximum gain and is, for example, approximately 645 nm at 40° C., and approximately 665 nm at 150° C., in accordance with the gain spectrum.

It shall be assumed that the radiation-producing zone of the pump laser has a temperature of 40° C., and the radiation-producing zone of the vertical emitter has a temperature of 150° C. The pump laser then pumps the vertical emitter at a wavelength of 645 nm, with complete excitation and complete bleaching of the radiation-emitting zone of the vertical emitter being achieved at the optimum. The charge carrier density in the radiation-emitting zone of the vertical emitter is thus established such that the radiation-emitting zone which, in the case of a vertically emitting laser, represents the laser-active area, is transparent for the pump radiation.

In the case of the InGaP-quantum film which has been mentioned as the quantum well structure, this transparency at 150° C. corresponds to a charge carrier density of about 10–13 cm-2. As can be seen from FIG. 3, this results in the vertical emitter having a gain of about 104 at an emission wavelength of about 665 nm.

We claim:

1. A semiconductor laser apparatus having a vertical emitter and having at least one pump laser for optically pumping the vertical emitter, with the vertical emitter and the pump laser being monolithically integrated, wherein, during operation, the pump laser has a radiation-emitting zone at a first temperature T1 and the vertical emitter has a radiation-emitting zone at a second temperature T2, and the first temperature T1 is lower than the second temperature T2.

2. The semiconductor laser apparatus as claimed in claim 1, wherein the pump laser and the vertical emitter are epitaxially grown on a common substrate.

3. The semiconductor laser apparatus as claimed in claim 1, wherein the pump laser and the vertical emitter are mounted on a common mount.

4. The semiconductor laser apparatus as claimed in claim 3, wherein a thermal resistance between the mount and the radiation-emitting zone of the pump laser is less than the thermal resistance between the mount and the radiation-emitting zone of the vertical emitter.

5. The semiconductor laser apparatus as claimed in claim 3, wherein the vertical emitter and the pump laser are arranged between a substrate and the mount.

6. The semiconductor laser apparatus as claimed in claim 3, wherein one mirror layer or two or more mirror layers is or are arranged between the radiation-emitting zone of the vertical emitter and the mount.

7. The semiconductor laser apparatus as claimed in claim 6, wherein the mirror layer or the mirror layers is or are formed as a Bragg mirror.

8. The semiconductor laser apparatus as claimed in claim 1, wherein
the pump laser has an active layer comprising its active zone, and the vertical emitter has an active layer comprising its active zone, with the active layer of the pump laser and the active layer of the vertical emitter having at least one of an identical structure and composition.

9. The semiconductor laser apparatus as claimed in claim 1, wherein
at least one of an active layer of the pump laser and an active layer of the vertical emitter is formed as a quantum well structure.

10. The semiconductor laser apparatus as claimed in claim 1, wherein
an active layer of the pump laser and an active layer of the vertical emitter are formed jointly in one epitaxy step.

11. The semiconductor laser apparatus as claimed in claim 1, wherein
the radiation-emitting zone of the pump laser produces pump radiation, which is injected into the radiation-emitting zone of the vertical emitter in a direction oblique or perpendicular to a main emission direction of the vertical emitter.

12. The semiconductor laser apparatus as claimed in claim 1, wherein
the pump laser is formed as an edge emitter.

13. The semiconductor laser apparatus as claimed in claim 1, wherein
the vertical emitter is formed as a vertically emitting laser.

14. The semiconductor laser apparatus as claimed in claim 8, wherein
at least one of the active layer of the pump laser and the active layer of the vertical emitter is formed as a quantum well structure.

15. The semiconductor laser apparatus as claimed in claim 8, wherein
the active layer of the pump laser and the active layer of the vertical emitter are formed jointly in one epitaxy step.

16. The semiconductor laser apparatus as claimed in claim 8, wherein
the radiation-emitting zone of the pump laser produces pump radiation, which is injected into the radiation-producing zone of the vertical emitter in a direction oblique or perpendicular to a main emission direction of the vertical emitter.

17. The semiconductor laser apparatus as claimed in claim 8, wherein
the pump laser is formed as an edge emitter.

18. The semiconductor laser apparatus as claimed in claim 8, wherein
the vertical emitter is formed as a vertically emitting laser.

19. The semiconductor laser apparatus as claimed in claim 3, wherein
the common mount is a heat sink.

20. The semiconductor laser apparatus as claimed in claim 13, wherein
the vertical emitting laser is a VCSEL or a disk laser.

21. The semiconductor laser apparatus as claimed in claim 18, wherein
the vertical emitting laser is a VCSEL or a disk laser.

* * * * *